(12) United States Patent
Ukiyo et al.

(10) Patent No.: US 9,401,259 B2
(45) Date of Patent: Jul. 26, 2016

(54) RADIATION GENERATING TUBE, AND RADIATION GENERATING APPARATUS AND RADIATION IMAGING SYSTEM USING THE SAME

(71) Applicant: CANON KABUSHIKI KAISHA, Tokyo (JP)

(72) Inventors: Noritaka Ukiyo, Inagi (JP); Yasue Sato, Machida (JP); Yoshihiro Yanagisawa, Fujisawa (JP); Kazuhiro Sando, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 35 days.

(21) Appl. No.: 14/293,493

(22) Filed: Jun. 2, 2014

(65) Prior Publication Data

US 2014/0369470 A1 Dec. 18, 2014

(30) Foreign Application Priority Data

Jun. 12, 2013 (JP) ................................ 2013-123299

(51) Int. Cl.

| | |
|---|---|
| *H01J 19/42* | (2006.01) |
| *H01J 35/16* | (2006.01) |
| *G21G 4/08* | (2006.01) |
| *H05G 1/04* | (2006.01) |
| *H01J 37/16* | (2006.01) |
| *H01J 35/08* | (2006.01) |
| *H01J 19/56* | (2006.01) |
| *H05G 1/06* | (2006.01) |

(52) U.S. Cl.
CPC ................ *H01J 35/16* (2013.01); *H01J 19/42* (2013.01); *H01J 37/16* (2013.01); *G21G 4/08* (2013.01);

(Continued)

(58) Field of Classification Search
CPC ................ H01J 1/00; H01J 1/02; H01J 1/04; H01J 17/16; H01J 19/42; H01J 19/44; H01J 19/54; H01J 19/56; H01J 23/12; H01J 35/00; H01J 35/02; H01J 35/16; H01J 35/32; H01J 37/00; H01J 3/02; H01J 37/16; H01J 61/00; H01J 61/02; H01J 61/30; H01J 61/302; H01J 61/33; H01J 61/34; H01J 61/36; H01J 61/362; H01J 61/363; H01J 61/52; H01J 61/523; H01J 2229/00; H01J 2229/0007; H01J 2229/48; H01J 2229/4827; H01J 2229/86; H01J 2229/8626; H01J 2229/863; H01J 2229/8636; H01J 2231/00; H01J 2231/50; H01J 2231/50005; H01J 2331/5001; H01J 2231/50031; H01J 2231/50036; H01J 2235/00; H01J 2235/16; H01J 2235/165–2235/167; H01J 2237/00; H01J 2237/16; H01J 2237/166; G12G 4/00; G12G 4/04; G12G 4/06; G12G 4/08; H05G 1/00; H05G 1/02; H05G 1/04
USPC ......... 378/119, 121, 140–142, 193, 199, 204, 378/210; 313/11, 17, 25–27, 33, 47, 420, 313/238, 243, 249, 250, 252, 253, 256, 257, 313/268, 284, 289, 292, 356; 315/85; 250/493.1, 522.1
See application file for complete search history.

(56) References Cited

U.S. PATENT DOCUMENTS 5,090,043 A * 2/1992 Parker .................. A61N 5/1001
378/121
5,627,871 A * 5/1997 Wang ........................ G03F 9/70
378/102

(Continued)

OTHER PUBLICATIONS

U.S. Appl. No. 14/258,641, filed Apr. 22, 2014.

*Primary Examiner* — Anastasia Midkiff
(74) *Attorney, Agent, or Firm* — Fitzpatrick, Cella, Harper & Scinto

(57) ABSTRACT

Provided is a radiation generating tube in which an insulating tube is prevented from being damaged by heat generation of a target or an electron emitting source during drive. Extending portions extending along an outer periphery of an insulating tube are provided to a cathode and an anode, respectively, and the insulating tube is joined to the extending portions to enhance the strength of joint portions. At the same time, the insulating tube can be deformed easily by setting a tube wall thickness of the insulating tube at a central portion in a longitudinal direction to be smaller than a tube wall thickness of an opening end, and thus the concentration of thermal stress on the joint portions caused by an increase in temperature of the cathode and the anode is alleviated.

18 Claims, 7 Drawing Sheets

(52) U.S. Cl.
CPC  *H01J 19/56* (2013.01); *H01J 35/08* (2013.01); *H01J 2229/4827* (2013.01); *H01J 2229/86* (2013.01); *H01J 2235/087* (2013.01); *H01J 2235/16* (2013.01); *H01J 2235/165* (2013.01); *H01J 2235/166* (2013.01); *H01J 2237/16* (2013.01); *H05G 1/04* (2013.01); *H05G 1/06* (2013.01)

(56) References Cited

U.S. PATENT DOCUMENTS

| | | |
|---|---|---|
| 2007/0076849 A1 | 4/2007 | Bard et al. |
| 2012/0307974 A1 | 12/2012 | Yamazaki et al. |
| 2012/0314837 A1 * | 12/2012 | Tsujii ............... H01J 35/08 378/62 |
| 2013/0016810 A1 | 1/2013 | Tamura et al. |
| 2013/0016811 A1 | 1/2013 | Ueda et al. |
| 2013/0016812 A1 | 1/2013 | Yanagisawa et al. |
| 2013/0034207 A1 | 2/2013 | Aoki et al. |
| 2013/0121473 A1 * | 5/2013 | Yamazaki ............ H01J 35/16 378/121 |
| 2013/0230143 A1 | 9/2013 | Ueda et al. |
| 2013/0235975 A1 | 9/2013 | Tamura et al. |
| 2014/0140480 A1 | 5/2014 | Ogura et al. |
| 2014/0140486 A1 | 5/2014 | Yanagisawa et al. |
| 2014/0153695 A1 | 6/2014 | Yanagisawa et al. |
| 2014/0177800 A1 | 6/2014 | Sato et al. |

* cited by examiner

RADIATION GENERATING TUBE, AND RADIATION GENERATING APPARATUS AND RADIATION IMAGING SYSTEM USING THE SAME

BACKGROUND OF THE INVENTION

1. Field of the Invention

The present invention relates to a radiation generating tube, and a radiation generating apparatus and a radiation imaging system including the radiation generating tube, which can be used for medical equipment, a nondestructive inspection apparatus, and the like, for example. This application claims the benefit of Japanese Patent Application No. 2013-123299, filed Jun. 12, 2013, which is incorporated by reference herein in its entirety.

2. Description of the Related Art

In general, a radiation generating apparatus includes a radiation generating tube as a radiation source. The radiation generating tube includes a vacuum container in which a cathode is mounted to one opening of an insulating tube and an anode is mounted to the other opening of the insulating tube. An electron emitting source is connected to the cathode, and the anode includes a target. The radiation generating tube irradiates the target with an electron emitted from the electron emitting source by applying a high voltage between the cathode and the anode, and thus generates a radiation such as an X-ray.

In order to keep an electron emitting property of the electron emitting source functioning, it is necessary to at least maintain or improve the joining reliability of elements when producing the vacuum container. For example, in U.S. Patent Application Publication No. 2007/0076849, there is disclosed a configuration in which a cathode of an insulating tube is joined to the insulating tube in both a longitudinal direction and a radial direction of the insulating tube.

When an electron beam emitted from the electron emitting source strikes the target, the target generates a radiation. In this case, most of the radiation changes to heat, and hence the target generates heat, which is transmitted to the anode holding the target to increase the temperature of the anode.

The radiation generating apparatus is filled with an insulating fluid serving as a refrigerant so as to cool a high-temperature portion of the radiation generating tube to equalize the temperature of the entire radiation generating tube. However, a rapid increase in temperature of the anode is not sufficiently handled by the temperature equalization by the insulating fluid in some cases. Specifically, in the case of rapid imaging in accordance with the movement of a circulatory organ or the like and the movement of a patient's body in a medical X-ray imaging apparatus, a short pulse and a large tube current are required so as to enhance a resolution, and a target increases in temperature rapidly in some cases. Also in the industrial field, there is a demand for a transmission inspection image having high resolution and for a high density packaging in an integrated device. For this purpose, it is requested to perform imaging with a focused electron beam entering a target, and hence the target increases in temperature rapidly in some cases.

The insulating tube formed of an insulator such as ceramics has a linear expansion coefficient lower than that of the anode formed of a conductor such as a metal. Therefore, in the case where the temperature of the anode and the insulating tube increases, thermal stress is caused due to the difference in linear expansion coefficient. Such thermal stress is concentrated on a joint portion having a low fracture toughness value between the insulating tube and the anode. Further, as described above, in the case where the anode increases in temperature rapidly, a temperature difference between the anode and the insulating tube is widened, and the thermal stress caused by the difference in linear expansion coefficient further increases, with the result that the joint portion between the insulating tube and the anode is subjected to damage such as cracks in some cases. Such damage to the insulating tube lowers the vacuum degree of the vacuum container, which is one cause for impairing the reliability of the radiation generating apparatus.

Also in the cathode, in the case where a hot cathode type electron emitting source is used, the electron emitting source generates heat by being driven, and the cathode increases in temperature rapidly. As a result, in the same way as in the anode, thermal stress is concentrated on the periphery of a joint portion between the insulating tube and the cathode, and the insulating tube is subjected to damage such as cracks in some cases.

SUMMARY OF THE INVENTION

The present invention is directed to providing a radiation generating tube in which an insulating tube is prevented from being damaged by heat generated from a target or an electron emitting source during drive, and to provide a radiation generating apparatus including the radiation generating tube and a radiation imaging system capable of performing imaging with high resolution.

According to a first aspect of the present invention, there is provided a radiation generating tube, including: an insulating tube having a pair of openings; a cathode covering one of the pair of openings and including an electron emitting source, the cathode having a peripheral portion joined to an end face of the one of the pair of openings; and an anode covering the other of the pair of openings and including a target, the anode having a peripheral portion joined to an end face of the other opening, in which at least one of the cathode or the anode includes an extending portion protruding along one of an inner periphery and an outer periphery of the insulating tube, and the extending portion is joined to the one of the inner periphery and the outer periphery of the insulating tube, and in which the insulating tube has at least a thinner tube wall region having a thinner tube wall thickness than a tube wall thickness of a region joined to the extending portion in an intermediate portion in a longitudinal direction of the insulating tube.

According to a second aspect of the present invention, there is provided a radiation generating apparatus, including: the radiation generating tube according to the first embodiment of the present invention; and a storage container accommodating the radiation generating tube and having an emission window for extracting a radiation generated from the radiation generating tube, in which a space left inside the storage container is filled with an insulating fluid.

According to a third aspect of the present invention, there is provided a radiation imaging system, including: the radiation generating apparatus according to the second embodiment of the present invention; a radiation detecting apparatus for detecting a radiation emitted from the radiation generating apparatus and transmitted through a subject to be investigated; and a control apparatus for controlling the radiation generating apparatus and the radiation detecting apparatus in a coordinated manner.

Further features of the present invention will become apparent from the following description of exemplary embodiments with reference to the attached drawings.

DESCRIPTION OF THE EMBODIMENTS

A radiation generating tube, a radiation generating apparatus, and a radiation imaging system according to embodiments of the present invention are hereinafter described with reference to the drawings.

Figure 1:
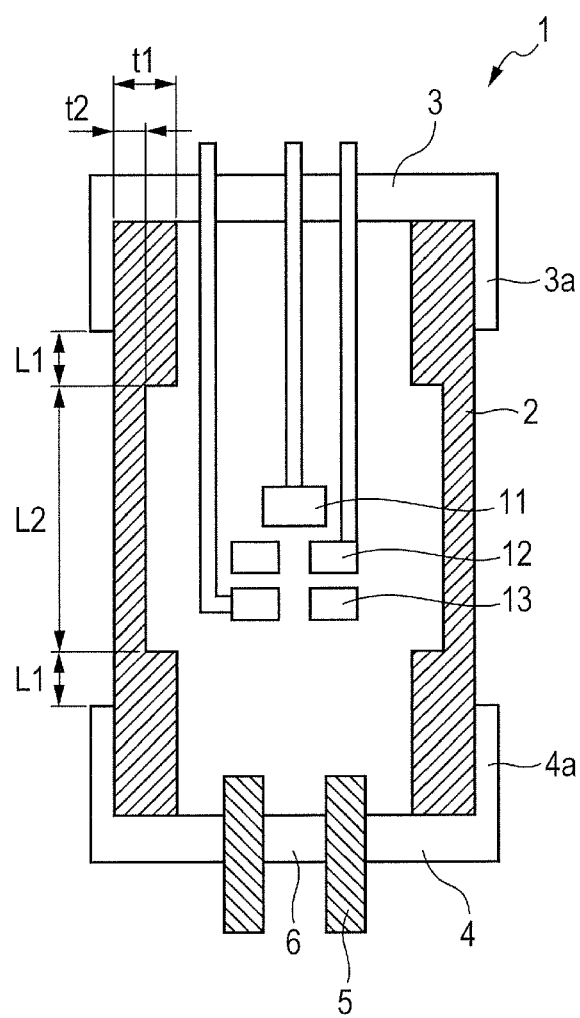
FIG. 1 is a schematic sectional view illustrating a configuration of a radiation generating tube according to an embodiment of the present invention.

As illustrated in FIG. 1, a radiation generating tube 1 of the present invention is a transmission type radiation generating tube including a vacuum container configured such that one of the pair of openings of the insulating tube 2 is covered with a cathode 3, the other of the pair of openings of the insulating tube 2 is covered with an anode 4, and a peripheral portion of each of the cathode 3 and the anode 4 is joined to each end face of the pair of openings of the insulating tube 2 respectively. The cathode 3 includes an electron emitting source 11, and the anode 4 includes a transmission type target 6.

The insulating tube 2 is formed of an electrically insulating material such as a ceramics material (alumina, etc.) or glass. Further, the cathode 3 and the anode 4 are formed of a low linear expansion coefficient alloy such as a NiCuFeMn alloy, a NiCrFe-based alloy, or a FeNiCo alloy, or a metal such as stainless steel. As the NiCuFeMn alloy, MONEL (trademark) is commercially available; as the NiCrFe-based alloy, INCONEL (trademark) is commercially available; and as the FeNiCo alloy, KOVAR (registered trademark) is commercially available.

Further, in this embodiment, the cathode 3 and the anode 4 respectively include extending portions 3a and 4a protruding to the outer periphery of the insulating tube 2, and the extending portions 3a and 4a are joined to the outer periphery of the insulating tube 2. In the present invention, the extending portions 3a and 4a are provided on at least one of the cathode 3 or the anode 4 so as to be joined to the insulating tube 2.

The electron emitting source 11 is disposed so as to be opposed to the target 6 provided on the anode 4 in the vacuum container. In the present invention, an extension electrode 12 and a lens electrode 13 may be further provided as illustrated in FIG. 1. In the case where the extension electrode 12 and the lens electrode 13 are provided in the vicinity of the electron emitting source 11, electrons emitted due to an electric field formed by the extension electrode 12 are converged by the lens electrode 13 and enter the target 6.

As the electron emitting source 11, a hot cathode such as a tungsten filament and an impregnated cathode, or a cold cathode such as a carbon nanotube can be used. At this time, when using the hot cathode such as the impregnated cathode, the temperature of the anode 3 including the electron emitting source 11 increases due to the heat from the heater.

The target 6 may be formed of a material that can emit radiation by electron irradiation or may have a structure including a radiation transmissive substrate and a target metal film formed thereon. As the radiation transmissive substrate, it is preferred to use a substrate having strength capable of supporting the target metal, little absorption of radiation generated by the target metal, and high thermal conductivity so that heat generated by the target metal can be rapidly dissipated. For instance, diamond, silicon carbide, aluminum nitride, or the like can be used.

As a material forming the target metal, it is preferred to use a material having a high melting point and high radiation generation efficiency. For instance, tungsten, tantalum, molybdenum, or the like can be used. In order to reduce absorption that occurs when the generated radiation passes through the target metal, it is appropriate that the target metal has a thickness of a few μm to ten and a few μm.

In the configuration example of FIG. 1, the target 6 is joined to and held in an electron passage of a radiation shield 5, and the radiation shield 5 is joined to the anode 4. The radiation shield 5 serves to block an unnecessary radiation and can be formed of lead or tungsten. However, the material for the radiation shield 5 is not limited thereto. In this embodiment, the electric potentials of the target 6 and the anode 4 are controlled with use of the radiation shield 5.

The target 6 and the radiation shield 5, the radiation shield 5 and the anode 4, the cathode 3 and the insulating tube 2, and the anode 4 and the insulating tube 2 are respectively joined to each other by vacuum-tight joint. As the vacuum-tight joint, brazing, casting, soldering, welding, laser welding, screwing, shrinkage fitting, taper embedding, or adhesive joint is used.

A voltage Va to be applied between the electron emitting source 11 and the target 6 in order to generate a radiation is about 40 kV to 120 kV although it varies depending on the application of the radiation. When an electron beam emitted from the electron emitting source 11 strikes the target 6, the target 6 generates a radiation. Most of the radiation changes to heat, and hence the target 6 generates heat to increase the temperature of the anode 4 holding the target 6.

The increase in temperature of the cathode 3 and the anode 4 as described above is transmitted to the insulating tube 2 joined to the cathode 3 and the anode 4, and thermal stress is generated in joint portions of the insulating tube 2. As described above, the insulating tube 2 has a fracture toughness value lower than that of the cathode 3 and the anode 4. In the case where the cathode 3 and the anode 4 increase in temperature rapidly and thermally expand, thermal stress is concentrated on the joint portions of the insulating tube 2 with respect to the cathode 3 and the anode 4, and the insulating tube 2 is subjected to damage such as cracks. In the configuration of FIG. 1, such thermal stress is mainly concentrated on the joint portions of the insulating tube 2 with respect to the extending portions 3a and 4a.

In the present invention, in order to alleviate thermal stress concentrated on the joint portions of the insulating tube 2, as illustrated in FIG. 1, there is provided a thinner tube wall region in an intermediate portion in a longitudinal direction of the insulating tube 2. Thus, by providing the thinner tube wall region whose tube wall thickness is smaller than that of regions of the insulating tube 2 joined to the extending portions 3a and 4a, the insulating tube 2 is deformed easily in the thinner tube wall region, and thermal stress can be eliminated by the deformation of the thinner tube wall region. Consequently, the thermal stress can be prevented from being concentrated on the joint portions of the insulating tube 2, and the insulating tube 2 can be protected from damage such as cracks.

Figure 2:
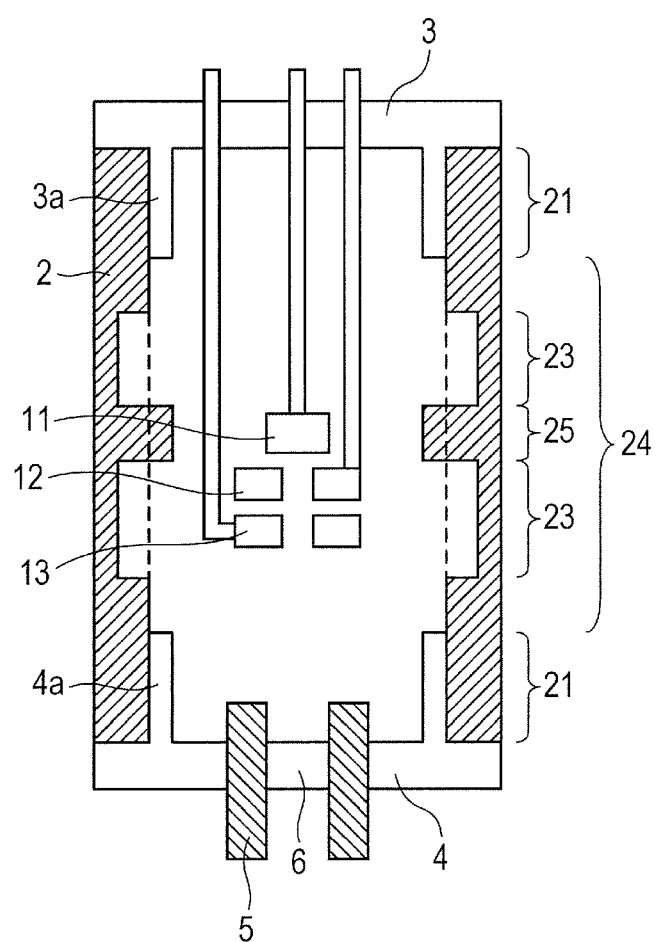
FIG. 2 is a schematic sectional view illustrating a configuration of a radiation generating tube according to another embodiment of the present invention.

In the present invention, the radiation generating tube 1 only needs to include the thinner tube wall region whose tube wall thickness is smaller than that of the regions of the insulating tube 2 joined to the extending portions 3a and 4a at least in the intermediate portion in the longitudinal direction of the radiation generating tube 1. Thus, the present invention also includes the following embodiment: the radiation generating tube 1 includes a region 25 whose tube wall thickness is larger than that of a joint region 21 and a region 23 whose tube wall thickness is smaller than that of the joint region 21 in an intermediate portion 24 of the insulating tube 2, as illustrated in FIG. 2. It is to be noted that the intermediate portion in the longitudinal direction of the insulating tube 2 refers to a region 24 other than the regions 21 of the insulating tube 2 joined to the extending portions 3a and 4a, as illustrated in FIG. 2. In the present invention, as illustrated in FIG. 1, it is preferred that a thinner tube wall region be provided in a central portion in the longitudinal direction of the insulating tube 2.

Based on a mechanism for reducing the concentration of thermal stress by the deformation of the insulating tube 2, when the wall thickness of the entire insulating tube 2 is smaller, the insulating tube 2 is more likely to be deformed. However, in order to enhance connection reliability, the joint portions of the insulating tube 2 with respect to the cathode 3 and the anode 4 are preferred to have a larger area, and the tube wall thickness in each joint portion is desired to be larger. Further, in the case where the tube wall thickness of the insulating tube 2 in the joint portion is small, the breakage pressure resistance with respect to the concentration of thermal stress decreases. Thus, it is preferred that the thinner tube wall region of the insulating tube 2 be separated from tip ends of the extending portions 3a and 4a by a tube wall thickness or more of the insulating tube 2 in the regions joined to the extending portions 3a and 4a. That is, it is preferred that t1<L1 be satisfied in FIG. 1.

Further, on the other hand, when the thinner tube wall region of the insulating tube 2 is too narrow, the effect of reducing the concentration of thermal stress is degraded. Therefore, it is preferred that a length L2 of the thinner tube wall region be 40% or more of the length of the insulating tube 2.

Further, when the thinner tube wall region of the insulating tube 2 is too thin, the strength of the insulating tube 2 is degraded. Therefore, it is preferred that a tube wall thickness t2 of the thinner tube wall region be 10% to 80% of a tube wall thickness t1 of a thicker tube wall region.

In the embodiment illustrated in FIG. 1, the cathode 3, the anode 4, and the insulating tube 2 are configured in such a manner that the extending portions 3a and 4a are joined to the outer periphery of the insulating tube 2, and the diameter of an inner periphery of the insulating tube 2 in the thinner tube wall region is larger than that in the thicker tube wall region. However, the present invention is not limited thereto. FIGS. 3A, 3B, 4A, 4B, and 4C are schematic sectional views illustrating other examples of the joint form between the cathode 3 and the insulating tube 2 and the sectional shape of the insulating tube 2. FIGS. 3A, 3B, 4A, 4B, and 4C illustrate only the joint form between the cathode 3 and the insulating tube 2. However, in the present invention, those forms may be also applied to the joint form between the anode 4 and the insulating tube 2.

Figure 3A:
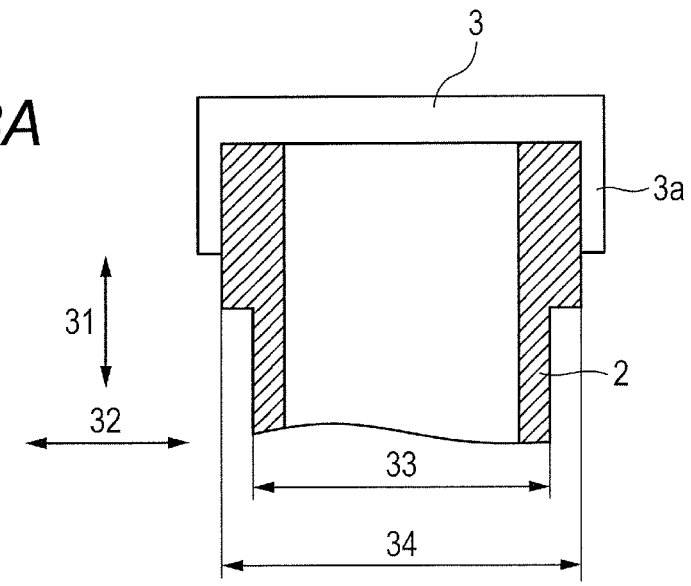
FIGS. 3A and 3B are schematic sectional views illustrating other examples of a joint form between a cathode and an insulating tube and a sectional shape of the insulating tube in the radiation generating tube of the present invention.
Figure 3B:
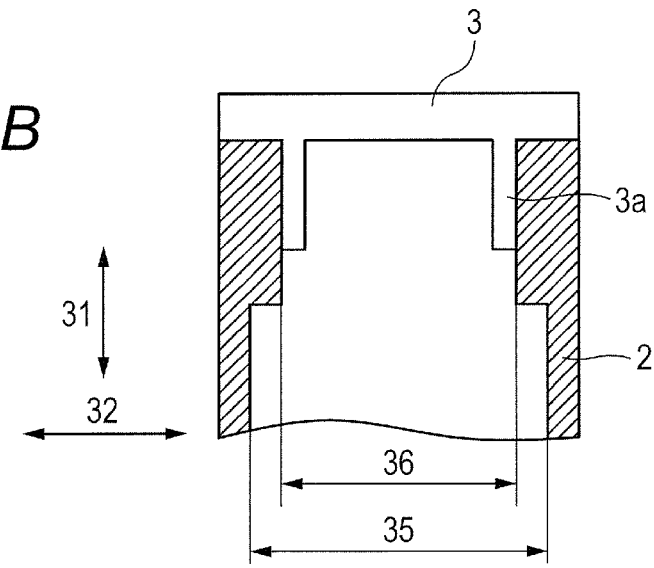
Figure 4A:
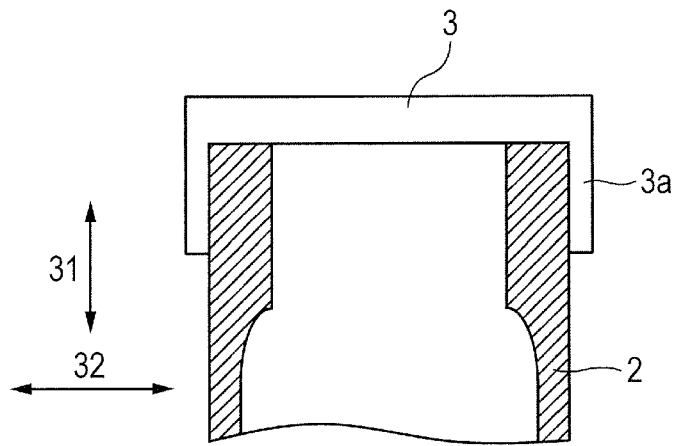
FIGS. 4A, 4B, and 4C are schematic sectional views illustrating other examples of the joint form between the cathode and the insulating tube and the sectional shape of the insulating tube in the radiation generating tube of the present invention.
Figure 4B:
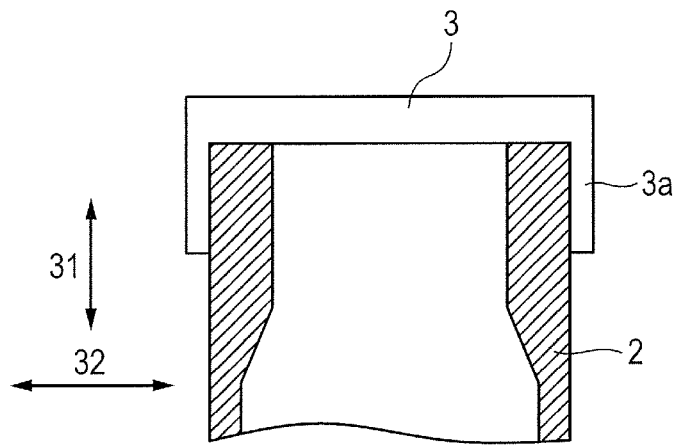
Figure 4C:
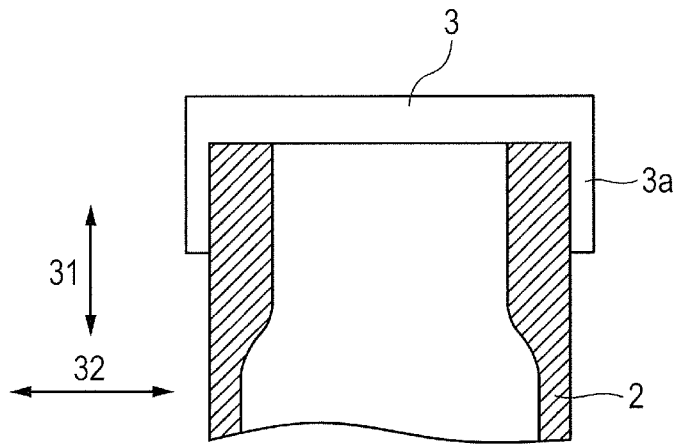

In FIGS. 3A and 3B, an arrow 31 represents a longitudinal direction of the insulating tube 2, that is, a tube axis direction, and an arrow 32 represents a direction orthogonal to the longitudinal direction, that is, a diameter direction in the case where the insulating tube 2 is a cylinder. In this embodiment, the case in which the insulating tube 2 is a cylinder is exemplified, but the insulating tube 2 may be a square tube in the present invention. FIG. 3A illustrates an embodiment in which a diameter 33 of the outer periphery of the thinner tube wall region of the insulating tube 2 is smaller than a diameter 34 of the outer periphery of the thicker tube wall region of the insulating tube 2. Further, FIG. 3B illustrates an embodiment in which the extending portion 3a of the cathode 3 is formed on an inner side with respect to the peripheral portion of the cathode 3, and the extending portion 3a is joined to the inner periphery of the insulating tube 2. FIG. 3B also illustrates an embodiment in which a diameter 35 of the inner periphery of the thinner tube wall region of the insulating tube 2 is larger than a diameter 36 of the inner periphery of the thicker tube wall region of the insulating tube 2. FIG. 4A illustrates an embodiment in which the tube wall thickness becomes small continuously in a curved manner from the thicker tube wall region of the insulating tube 2 to the thinner tube wall region thereof. FIG. 4B illustrates an embodiment in which the tube wall thickness becomes small continuously in a linear manner from the thicker tube wall region of the insulating tube 2 to the thinner tube wall region thereof. FIG. 4C illustrates an embodiment in which the tube wall thickness becomes small continuously in a curved manner from the thicker tube wall region of the insulating tube 2 to the thinner tube wall region thereof in the same way as in FIG. 4A. The embodiment illustrated in FIG. 4C is preferred because a side surface of the insulating tube 2 has no corner portion in a cross-section, and hence the effect of alleviating the concentration of thermal stress is high.

It is to be noted that in FIGS. 3B and 4A to 4C, the thinner tube wall region of the insulating tube 2 has a configuration in which the position of the inner periphery of the insulating tube 2 in the diameter direction 32 changes in the tube axis direction 31. However, the present invention is not limited thereto. As illustrated in FIG. 3A, the position of the outer periphery of the insulating tube 2 in the diameter direction 32 may change in the tube axis direction 31, or those embodiments may be combined.

The inside of the radiation generating tube 1 can be vacuumed by evacuating the air with use of an exhausting tube (not shown) and then by sealing the exhausting tube. It is possible to dispose a getter (not shown) in the radiation generating tube 1 produced in this way for further increasing the degree of vacuum.

Figure 5:
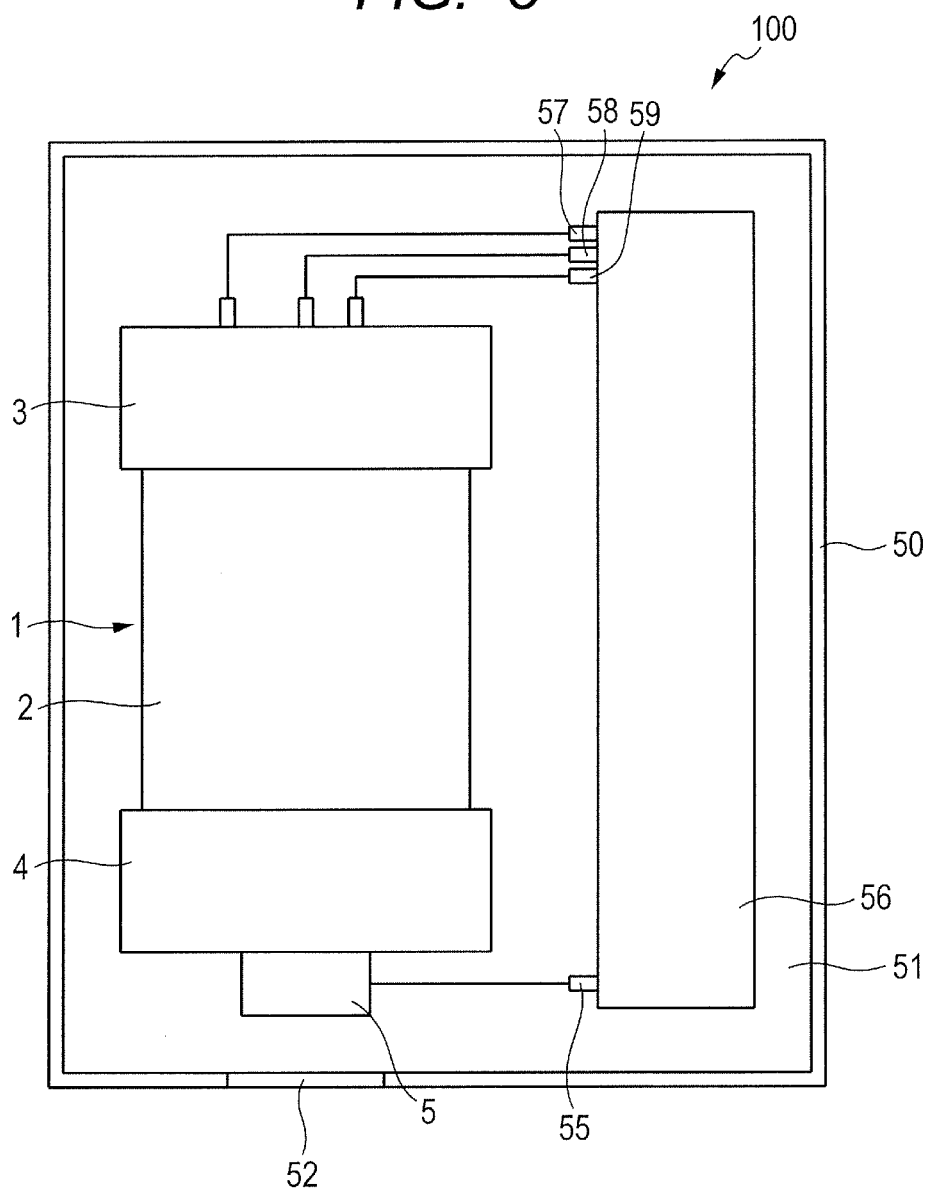
FIG. 5 is a schematic sectional view illustrating a configuration of a radiation generating apparatus according to an embodiment of the present invention.

Next, a radiation generating apparatus including a radiation generating tube of the present invention is described. FIG. 5 is a schematic sectional view illustrating an example of a configuration of the radiation generating apparatus including the radiation generating tube 1 of FIG. 1.

A radiation generating apparatus 100 of FIG. 5 includes the transmission type radiation generating tube 1, and the radiation generating tube 1 is accommodated in a storage container 50. A space left accommodating the radiation generating tube 1 in the storage container 50 is filled with an insulating fluid 51. A drive circuit 56 including a circuit substrate and an insulating transformer (not shown) may be disposed inside the storage container 50. In the case where the drive circuit 56 is disposed, for instance, a voltage signal is applied to the radiation generating tube 1 from the drive circuit 56 via terminals 55, 57, 58, and 59 so that generation of the radiation can be controlled.

The storage container 50 only needs to have strength sufficient for a container and is made of a metal or plastic material. The storage container 50 includes an emission window 52 that transmits a radiation so as to extract the radiation to the outside of the storage container 50. The radiation emitted by the radiation generating tube 1 passes through this emission window 52 and is emitted to the outside. The emission window 52 is made of glass, aluminum, beryllium, or the like.

The insulating fluid 51 only needs to have an electric insulation property, and the insulating fluid 51 may be a liquid or a gas. For example, when the cooling effect of an insulating medium and the radiation generating tube 1 is given greater importance, it is preferred to use electrical insulating oil serving as a cooling medium. As the electrical insulating oil, mineral oil, silicone oil, a fluorine-based electrical insulating liquid, or the like is suitably used. On the other hand, when light weight and miniaturization are given greater importance, it is preferred to use a gas because the apparatus can be rendered light-weight compared to the case of using an insulating liquid. As the gas, air, sulfur hexafluoride, or the like is used, and sulfur hexafluoride is more suitably used.

Next, a radiation imaging system according to an embodiment of the present invention is described with reference to FIG. 6.

Figure 6:
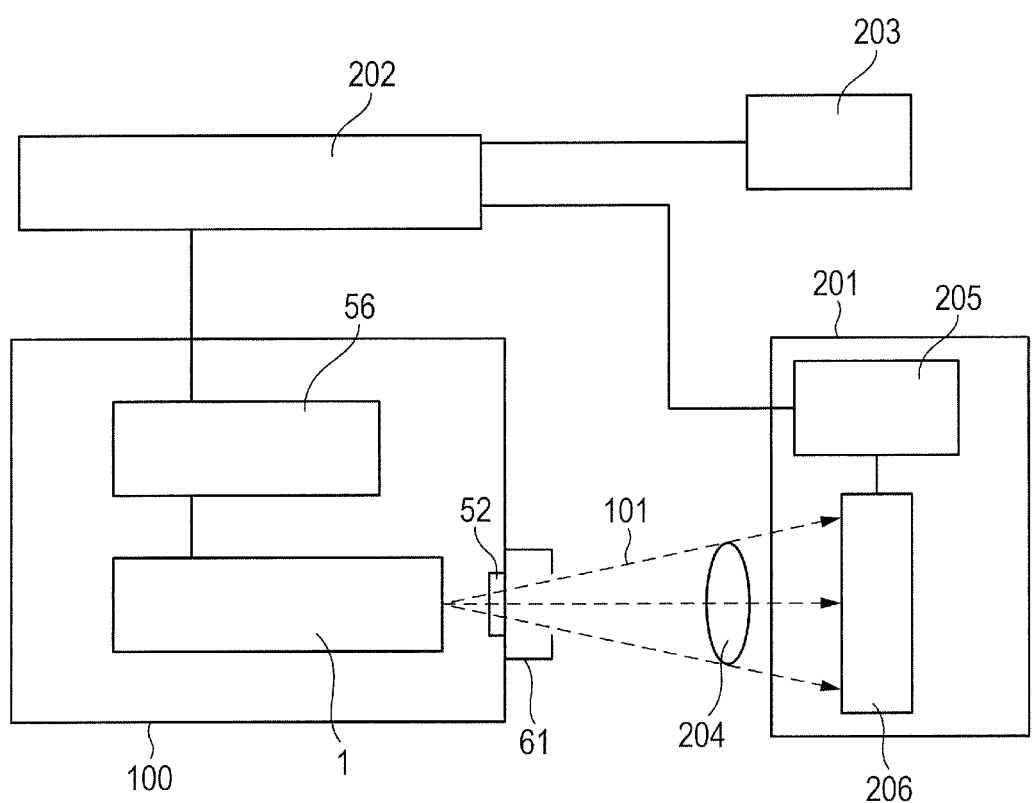
FIG. 6 is a block diagram schematically illustrating a configuration of a radiation imaging system according to an embodiment of the present invention.

As illustrated in FIG. 6, the radiation generating apparatus 100 of the present invention includes a movable diaphragm unit 61 disposed at a part corresponding to the radiation emission window 52. The movable diaphragm unit 61 has a function of adjusting a radiation field of a radiation 101 radiated from the radiation generating apparatus 100. In addition, it is possible to use the movable diaphragm unit 61 having an additional function to perform simulation display of the radiation field of the radiation using visible light.

A system control apparatus 202 controls the radiation generating apparatus 100 and a radiation detecting apparatus 201 in a coordinated manner. The drive circuit 56 outputs various control signals to the radiation generating tube 1 under control by the system control apparatus 202. This control signal controls an emission state of the radiation 101 emitted from the radiation generating apparatus 100. The radiation 101 emitted from the radiation generating apparatus 100 passes through a subject to be investigated (hereinafter, simply referred to as "subject") 204 and is detected by a detector 206. The detector 206 converts the detected radiation into an image signal and outputs the image signal to a signal processing portion 205. Under control by the system control apparatus 202, the signal processing portion 205 performs predetermined signal processing on the image signal and outputs the processed image signal to the system control apparatus 202. The system control apparatus 202 generates a display signal for controlling a display apparatus 203 to display an image based on the processed image signal and outputs the display signal to the display apparatus 203. The display apparatus 203 displays an image based on the display signal as a photographed image of the subject to be investigated 204 on a screen.

A typical example of the radiation is an X-ray. The radiation generating apparatus and the radiation imaging system of the present invention can be used as an X-ray generating apparatus and an X-ray imaging system. The X-ray imaging system can be used for nondestructive inspection of an industrial product or pathological diagnosis of a human body or an animal body.

Example 1

Figure 7A:
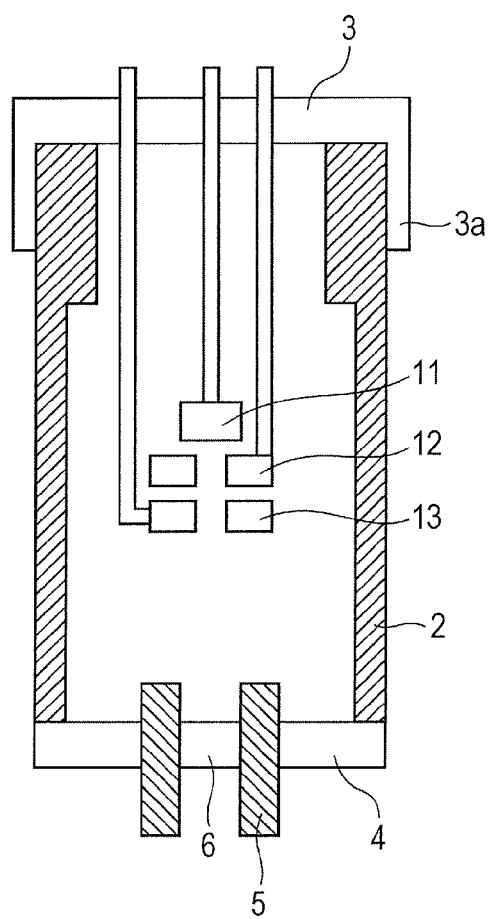
FIGS. 7A and 7B are schematic sectional views illustrating a configuration of a radiation generating tube of Examples of the present invention.

The radiation generating apparatus illustrated in FIG. 5 including the radiation generating tube 1 having a schematic configuration illustrated in FIG. 7A was produced.

As the insulating tube 2, a cylindrical insulating tube made of alumina having a length of 80 mm, an outer periphery diameter of 50 mm, an inner periphery diameter in a thicker tube wall portion of 40 mm, and an inner periphery diameter in a thinner tube wall portion of 44 mm was used. The tube wall thickness of the thicker tube wall portion was 5 mm, and the tube wall thickness of the thinner tube wall portion was 3 mm. The thicker tube wall portion of the insulating tube 2 was formed to extend in a range of 11 mm from the one of the pair of openings toward the other of the pair of openings. A region extending from a position of 11 mm from one of the pair of openings to a position of 23 mm therefrom toward the other of the pair of openings was formed as a tube wall thickness changing region between the thicker tube wall portion and the thinner tube wall portion so that the tube wall thickness became small continuously in a linear manner as illustrated in FIG. 4B. The thicker tube wall portion extended to a position of 6 mm from an end portion of the extending portion 3a of the cathode 3.

The cathode 3 had a configuration in which the tubular extending portion 3a having a length of 5 mm and a thickness of 0.75 mm protruded from a peripheral edge of a disk having a diameter of 51.5 mm and a thickness of 3 mm. The anode 4 had a disk shape having a diameter of 50 mm and a thickness of 8 mm without an extending portion. The cathode 3 and the anode 4 were formed through use of KOVAR (registered trademark).

The electron emitting source 11 made of a tungsten filament, the extension electrode 12, and the lens electrode 13 were mounted to the cathode 3.

The target 6 obtained by applying tungsten serving as a target metal to an inner side of a base material made of diamond was mounted to the radiation shield 5 made of tungsten by brazing. Further, the radiation shield 5 was welded to the anode 4.

The cathode 3 was joined to one of the pair of openings on a thicker tube wall side of the insulating tube 2, and the anode 4 was joined to an opening on a thinner tube wall thickness side of the insulating tube 2. The inside of the insulating tube 2 was vacuumed through use of the exhausting tube (not shown), and the exhausting tube was sealed to obtain the radiation generating tube 1.

The radiation generating tube 1 was accommodated in the storage container 50 made of stainless steel, which included the radiation emission window 52 for transmitting a radiation, which was made of beryllium. The storage container 50 was filled with an insulating oil serving as the insulating fluid 51 for ensuring a withstanding voltage to obtain the radiation generating apparatus.

In the radiation generating tube 1 of this example, the cathode 3 increases in temperature due to the heat generation of the electron emitting source 11, and further, the increase in temperature of the cathode 3 is transmitted to the insulating tube 2. The insulating tube 2 and the cathode 3 are different in material and linear expansion coefficient, and hence thermal stress is concentrated on a joint portion between the insulating tube 2 and the cathode 3 due to the expansion of the cathode 3 caused by the increase in temperature. In particular, in the case where a temperature difference is caused between the cathode 3 and the insulating tube 2 due to a rapid increase in temperature of the cathode 3, thermal stress is concentrated on the insulating tube 2 having a low linear expansion coefficient, and the insulating tube 2 is damaged. However, in this example, the insulating tube 2 is deformed in the thinner tube wall region to alleviate the concentration of thermal stress on the joint portion, and the maximum thermal stress applied to the insulating tube 2 can be reduced by about 15%. Thus, a decrease in vacuum degree of the radiation generating tube 1 to be caused by the damage such as cracks of the insulating tube 2 can be prevented.

Example 2

Figure 7B:
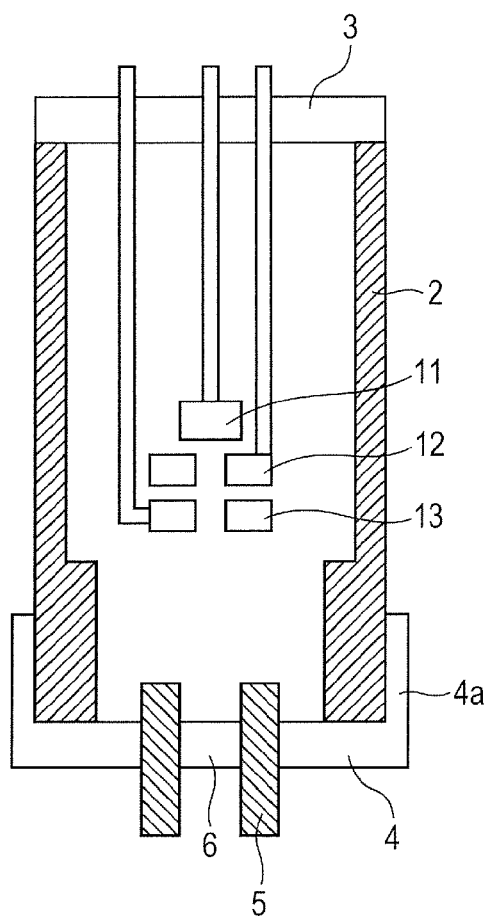

As illustrated in FIG. 7B, a radiation generating apparatus was produced in the same way as in Example 1 with the exception that the shapes of the cathode 3 and the anode 4 and the position of the thicker tube wall region of the insulating tube 2 were opposite to those of Example 1.

In this example, an increase in temperature of the anode 4 caused by the heat generation of the target 6 is transmitted to the insulating tube 2, and thermal stress is concentrated on a joint portion between the insulating tube 2 and the anode 4. However, also in this example, the insulating tube 2 is deformed in the thinner tube wall region to alleviate the concentration of thermal stress on the joint portion, and a decrease in vacuum degree of the radiation generating tube 1 to be caused by the damage such as cracks of the insulating tube 2 can be prevented.

Example 3

A radiation generating apparatus was produced in the same way as in Examples 1 and 2 with the exception that the radiation generating tube as illustrated in FIG. 1 was obtained by combining Examples 1 and 2.

In this example, the concentration of thermal stress in the joint portions of the insulating tube 2 with respect to the cathode 3 and the anode 4 caused by an increase in temperature of both the cathode 3 and the anode 4 can be alleviated, and a decrease in vacuum degree of the radiation generating tube 1 to be caused by damage such as cracks of the insulating tube 2 can be prevented.

According to the present invention, the extending portion is provided to at least one of the anode and the cathode to join the extending portion to the insulating tube, to thereby increase the strength of the joint portion. Further, a thinner tube wall region is provided in the intermediate portion in the longitudinal direction of the insulating tube, and thus thermal stress concentrated on the joint portion can be eliminated by the thinner tube wall region. Thus, the radiation generating apparatus and the radiation imaging system are provided, in which even when the anode or the cathode increases in temperature rapidly during drive, the insulating tube of the radiation generating tube is not subjected to damage such as cracks, and which can be driven for a long period of time without degrading the vacuum degree of the vacuum container.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An X-ray generating tube, comprising:
an insulating tube having a tube body extending along a longitudinal direction and a pair of ends;
a cathode secured to one of the pair of ends and including an electron emitting source, the cathode having a peripheral portion joined to an end face of the one of the pair of ends; and
an anode secured to the other of the pair of ends and including a target, the anode having a peripheral portion joined to an end face of the other of the pair of ends,
wherein at least any one of the cathode and the anode includes a tubular extending portion extending along the longitudinal direction,
wherein the tubular extending portion has a higher coefficient of thermal expansion than the insulating tube,
wherein the tubular extending portion is secured to the insulating tube via a tubular joint portion, and
wherein the insulating tube has a thinner tube wall region having a thinner tube wall than the tubular joint portion of the insulating tube, said thinner tube wall region being distant from the tubular joint portion along the longitudinal direction.

2. The X-ray generating tube according to claim 1, wherein the thinner region is located in an intermediate portion in a longitudinal direction of the insulating tube.

3. The X-ray generating tube according to claim 1, wherein a tube wall thickness of the insulating tube at a central portion in the longitudinal direction is smaller than the tube wall thickness of the tubular joint portion of the insulating tube.

4. The X-ray generating tube according to claim 1, wherein, in the longitudinal direction of the insulating tube, the thinner tube wall region is separated from an end of the tubular extending portion by at least a thickness of the tubular joint portion of the insulating tube.

5. The X-ray generating tube according to claim 1, wherein the tube wall thickness becomes smaller continuously from a thicker tube wall region of the insulating tube to the thinner tube wall region of the insulating tube.

6. The X-ray generating tube according to claim 1, wherein the tubular extending portion is joined to the outer periphery of the insulating tube.

7. The X-ray generating tube according to claim 1, wherein the tubular extending portion is joined to the inner periphery of the insulating tube.

8. The X-ray generating tube according to claim 1, wherein the tubular extending portion protrudes from the at least any one of the cathode and the anode toward the other of the cathode and the anode.

9. The X-ray generating tube according to claim 1, wherein the cathode and the anode each include the tubular extending portion.

10. The X-ray generating tube according to claim 1, wherein a length of the thinner tube wall region of the insulating tube is 40% or more of a length of the insulating tube.

11. The X-ray generating tube according to claim 1, wherein the tube wall thickness of the insulating tube in the thinner tube wall region is 10% to 80% with respect to a tube wall thickness of the insulating tube in a thicker tube wall region thereof.

12. The X-ray generating tube according to claim 1, wherein the insulating tube is made of one of ceramics and glass, and the cathode and the anode are made of a metal.

13. The X-ray generating tube according to claim 12, wherein the metal comprises any one of a NiCuFeMn alloy, a NiCrFe-based alloy, a FeNiCo alloy, and stainless steel.

14. The X-ray generating tube according to claim 1, wherein the X-ray generating tube comprises a transmission type X-ray generating tube.

15. An X-ray generating apparatus, comprising:
the X-ray generating tube according to claim 1; and
a storage container accommodating the X-ray generating tube and having an emission window for extracting a radiation generated from the X-ray generating tube,
wherein a space left inside the storage container is filled with an insulating fluid.

16. The X-ray generating apparatus according to claim 15, further comprising a movable diaphragm unit for adjusting an X-ray field of the X-ray emitted from the emission window of the storage container.

17. A radiography system, comprising:
the X-ray generating apparatus according to claim 15;
an X-ray detecting apparatus for detecting an X-ray emitted from the X-ray generating apparatus and transmitted through a subject to be investigated; and
a control apparatus for controlling the X-ray generating apparatus and the X-ray detecting apparatus in a coordinated manner.

18. The X-ray generating tube according to claim 1, wherein the thinner tube wall region is provided in the insulating tube configured to relax a thermal stress due to a difference in the coefficient of thermal expansion between the insulating tube and the tubular extending portion.

* * * * *